(12) United States Patent
Brase et al.

(10) Patent No.: US 6,576,550 B1
(45) Date of Patent: Jun. 10, 2003

(54) 'VIA FIRST' DUAL DAMASCENE PROCESS FOR COPPER METALLIZATION (75) Inventors: Gabriela Brase, Maroues-en-Hunpoix (FR); Uwe Paul Schroeder, Dresden (DE); Karen Lynne Holloway, Poughkeepsie, NY (US)

(73) Assignee: Infineon, AG, Munich (DE)

(*) Notice: Subject to any disclaimer, the term of this patent is extended or adjusted under 35 U.S.C. 154(b) by 516 days.

(21) Appl. No.: 09/608,541

(22) Filed: Jun. 30, 2000

(51) Int. Cl.[7] .............................................. H01L 21/44
(52) U.S. Cl. ..................... 438/687; 438/624; 438/634; 438/636; 438/637; 438/638; 438/672; 438/675
(58) Field of Search ................ 438/687, 624, 438/636, 637, 638, 672, 675, 634

(56) References Cited

U.S. PATENT DOCUMENTS

| | | |
|---|---|---|
| 5,904,565 A | 5/1999 | Nguyen et al. |
| 6,023,102 A | 2/2000 | Nguyen et al. |
| 6,057,239 A | 5/2000 | Wang et al. |
| 6,127,258 A | 10/2000 | Watanabe et al. |
| 6,143,646 A * | 11/2000 | Wetzel ........................ 438/637 |
| 6,165,899 A * | 12/2000 | Matumoto ................. 4381/638 |
| 6,174,810 B1 * | 1/2001 | Islam et al. .................. 438/687 |
| 6,245,662 B1 | 6/2001 | Naik et al. |
| 6,251,774 B1 | 6/2001 | Harada et al. |
| 6,291,331 B1 * | 9/2001 | Wang et al. ................. 438/624 |
| 6,297,149 B1 * | 10/2001 | Stamper ...................... 438/637 |
| 6,300,235 B1 * | 10/2001 | Feldner et al. .............. 438/637 |
| 6,309,955 B1 * | 10/2001 | Subramanian et al. ...... 438/624 |
| 6,319,821 B1 * | 11/2001 | Liu et al. ..................... 438/636 |
| 6,323,123 B1 * | 11/2001 | Liu et al. ..................... 438/638 |
| 6,352,917 B1 * | 3/2002 | Gupta et al. ................. 438/638 |
| 2001/0008226 A1 | 7/2001 | Hung et al. |

FOREIGN PATENT DOCUMENTS

WO    WO 01/01480    1/2001

* cited by examiner

Primary Examiner—John F. Niebling
Assistant Examiner—Lynne A. Gurley
(74) Attorney, Agent, or Firm—Slater & Matsil, L.L.P.

(57) ABSTRACT

An interconnection pattern is formed over the surface of a silicon wafer in which both the vias and the trenches of the pattern are filled with copper. The process of filling the vias and trenches involves use of a silicon nitride film as an etch stop and the filling of the vias with an anti-reflection coating.

17 Claims, 6 Drawing Sheets

'VIA FIRST' DUAL DAMASCENE PROCESS FOR COPPER METALLIZATION

FIELD OF THE INVENTION

This invention relates to integrated circuit devices using copper for interconnecting discrete circuit components as part of the back-end-of-the-line processing of semiconductive silicon wafers, and particularly, to modifications in wafer processing needed to protect the copper during chemical etching when the via is etched before the trench in a dual Damascene process.

BACKGROUND OF THE INVENTION

The demand for faster integrated circuits is driving the technologists to make the solid state components on a chip smaller and to increase the packing density. As a result of this demand, the interconnect metallurgy is shifting from aluminum-based metals to copper, which has a lower resistivity. The higher conductivity and lower cost of copper makes it very desirable for interconnecting the circuit components. Also, copper has a better resistance to electromigration failures than Al or Al—Cu and therefore, better reliability.

Although copper has very favorable electrical properties, it is prone to oxidation and corrosion when it comes in contact with some commonly-used processing chemicals. Therefore, it is critical that the processes used in conjunction with copper metallization be free from these environments when the copper is exposed, that is, not covered, during processing. Al and Al—Cu back-end-of-the-line metallizations are not prone to corrosion because of the protective oxide covering the metal surfaces in these materials.

Copper is a very viable material as the back-end-of-the-line metal when the single or dual Damascene processes are used. The Damascene process makes use of a series of trenches formed in an insulating layer. After the trenches are overfilled with copper, a chemical mechanical polishing process (CMP) is used to remove the overfill. Trenches are to be distinguished from vias. Trenches are extended grooves, typically extending parallel to the top surface of the silicon chip, that are patterned to interconnect circuits on the same level of the back-end-of-the-line process whereas vias are holes, typically extending normal to the surface, that are patterned to connect the metal lines from layer to layer.

Present technology uses a 'trench first' approach. Initially, the 'via first' approach was compromised because of the need for multiple layers of a relatively thick silicon nitride film. The silicon nitride, which protected the copper during processing had to, by necessity, remain behind in many of the active areas. These silicon nitride layers, however, resulted in a substantial increase in the dielectric properties of the stack and degraded the performance of the circuit. If the silicon nitride films were made thinner, they would degrade during the via etch. Also, the via etch could etch into the oxide that defines the trench. Even small changes in the line definition can cause serious reliability problems when 0.25 um ground rules are in place.

Since copper is known to be very sensitive to its environment, photoresists, which typically contain sulfur, and oxidizing chemicals should not be permitted to come in contact with the copper surfaces during processing. In this invention silicon nitride is used both as a protective layer for the copper and as an etch stop.

The 'trench first' approach however, also has its limitations. These limitations are associated with the photolithographic processing of the wafer. The difficulties occur when the trench configurations lead to differences in photoresist thicknesses. The thickness variations are seen in either broad trenches (wide lines) or very dense trenches (closely spaced narrow lines) as required, for example, by DRAMS and cause printing distortions of the via images.

The present invention seeks to provide a protective layer of silicon nitride over the copper while using a novel approach for assuring that the silicon nitride is not damaged during the simultaneous etching of the vias and trenches.

SUMMARY OF THE INVENTION

This invention relates to the use of the preferred 'via first' approach for forming vias (openings, holes) and trenches (grooves) in a passivating layer by using the double Damascene process.

In an exemplary embodiment, a contact metallurgy is deposited into a patterned glass layer (e.g., boron phospho silicate glass (BPSG)] and the glass is planarized. A different insulating material, such as silicon oxide, is then deposited onto the glass layer and patterned to form shallow via openings aligned with the contacts. The vias are filled with copper and the surface is planarized with a chem-mech polish. A thin silicon nitride layer is deposited onto the planarized insulator surface to act as a barrier layer/etch stop.

An $SiO_2$ layer is deposited over the silicon nitride layer and patterned by a conventional photolithographic technique to form therein via holes aligned with the earlier vias.

In the present invention an unconventional use is advantageously made of an anti-reflective coating material (ARC) which is spun onto the wafer. The coating of ARC fills the vias and covers the rest of the surface with a thin ARC layer. With the ARC material in place, photoresist is spun onto the wafer and patterned to form the trench configuration. The $SiO_2$ layer, which contains the vias, is etched again to form the trenches. During the trench etching the ARC material is also etched but at a rate different from the $SiO_2$. As a result of this differential etch rate, a plug of ARC material remains in the bottom of the vias after the trench open process has been completed. This ARC plug protects the silicon nitride from degrading which, in turn, protects the underlying copper because the etchant never comes into contact with the copper.

To this end, one feature of the invention is the use of a silicon nitride film to protect the copper during the etching of the insulating layers. In particular this silicon nitride layer should be thin so that the increase in the dielectric properties of the stack is kept to a minimum.

Another feature of the invention is on the use of an anti-reflective coating (ARC) to protect the silicon nitride layer. Normally, in the fabrication of semiconductive chips, photoresist materials are used as protective layers in addition to providing a photolithographic medium for component definition of the silicon, insulators and metals.

A related feature of the invention involves the etching of the ARC layer so as to insure that it is not entirely removed from the vias. After the etching of the vias and trenches has been completed, the ARC coating is removed as part of the photoresist strip process.

Viewed from a first process aspect, the present invention is directed to a method for forming over a semiconductive wafer, which contains therein and/or thereon devices having conductive contact regions, an interconnection pattern that uses copper in at least some vias and some trenches through insulating layers overlying a top surface of the semiconductor wafer. The method comprises the steps of: forming a first insulating layer over the device; forming vias from a top surface of the first insulating layer therethrough with the vias being in communication with the contact regions of the device; filling the vias with a conductor; forming a second insulating layer over the first insulating layer; forming vias through the second insulating layer which are in communication with the conductor filled vias in the first insulating layer; filling the vias through the second insulating layer with copper; forming a third insulating layer over a top surface of the second insulating layer; forming a fourth insulating layer over a top surface of the third insulating layer, the fourth insulating layer having a different etch characteristic than the third insulating layer; patterning and etching the fourth insulating layer to form vias therethrough which are separated from the copper-filled vias through the second insulating layer by the third insulating layer but are aligned with the vias through the second insulating layer; forming an anti-reflective layer over a top surface of the fourth insulating layer and filling the vias therethrough with anti-reflective material; patterning the anti-relective layer and material to define trenches in the fourth insulating layer; removing the layer of anti-reflective layer and a portion of the fourth insulating layer to form trenches in the fourth insulating layer which are in communication with top portions of the vias through the fourth insulating layer, and removing the anti-reflective material in the vias through the fourth insulating layer and a portion of the third insulating layer between the vias of the second and fourth insulating layers; filling the trenches and vias in the fourth insulating layer and portions of the third insulating layer which were removed with copper.

Viewed from a second process aspect, the present invention is directed to a method for forming over a semiconductive wafer an interconnection pattern that is in insulating layers overlying the semiconductive wafer and that includes copper lines in trenches extending parallel to a top surface of the wafer and copper fill in vias that extend vertically through insulating layers. The method comprises the steps of: forming over a top surface of the semiconductive wafer a first insulating layer; forming trenches in a top surface of the first insulating layer and forming vias, which are in communication with the trenches, from bottoms of the trenches through the first insulating layer such that same are in communication with the contact regions of the device; overfilling the vias and trenches of the first insulating layer with contact metal and planarizing to leave a first planar surface over the semiconductive wafer; forming over the metal-filled first insulating layer a second insulating layer; forming vias and trenches in the second insulating layer and overfilling the vias and trenches with copper; forming a second planar surface on the copper-filled second insulating layer; forming a silicon nitride layer over the planarized surface; depositing a third insulating layer over the silicon nitride layer, said third insulating layer having a different etch rate than the silicon nitride layer; patterning the third insulating layer to form vias therethrough which are aligned with the underlying copper, the silicon nitride film acting as an etch stop; forming an anti-reflecting material layer over a top surface of the third insulating layer which also fills the vias therethrough; depositing a layer of photoresist over the anti-reflective layer and the vias filled with the anti-reflective material; patterning the photoresist and etching exposed portions of the anti-reflective layer and anti-reflective material in the vias and portions of the third insulating layer to form trenches in the third insulating layer; removing the patterned photoresist, the anti-reflective material from the vias and a portion of the silicon nitride layer between the second and third insulating layers to result in each trench and the via there below in the third insulating layer being in communication with one of the vias in the second insulating layer; and overfilling the vias and trenches in the third insulating layer and the openings in the silicon nitride layer with copper and planarizing the surface to leave second copper-filled vias and trenches in the third insulating layer which extend through the openings in the silicon nitride layer and contact copper in the vias in the second insulating layer.

A better understanding of the invention together with a fuller appreciation of it advantages will be gained from the following detailed description and claims in conjunction with the accompanying drawings.

BRIEF DESCRIPTION OF THE DRAWINGS

Each of the FIGS. 1–6 shows a portion of a semiconductive wafer at successive stages of processing in accordance with an exemplary embodiment of the invention to provide metal-filled vias and trenches as parts of the interconnection pattern of conductors of the integrated circuit formed in the semiconductive wafer.

The drawings are not necessarily to scale.

DETAILED DESCRIPTION

In this specification the back-end-of-the-line processing for a dual Damascene process requires that both vias and trenches be etched into the silicon oxide or silica glass insulating layers between different levels of the conductive interconnection pattern. For the 'via first' approach it is necessary that both the vias and trenches are in place before the copper is deposited. It is advantageous to fill both during one deposition process to reduce process complexity. Silicon nitride film that is in place to protect the first level of metal must be removed subsequently so that there is a metal to metal contact between the first level copper lines and the first vias.

As has been discussed above, it has been the usual practice to use a 'trench first' approach. The use of the 'via first' approach offers a number of advantages as long as the copper remains protected during the processing so that its conductivity is not compromised.

Figure 1:
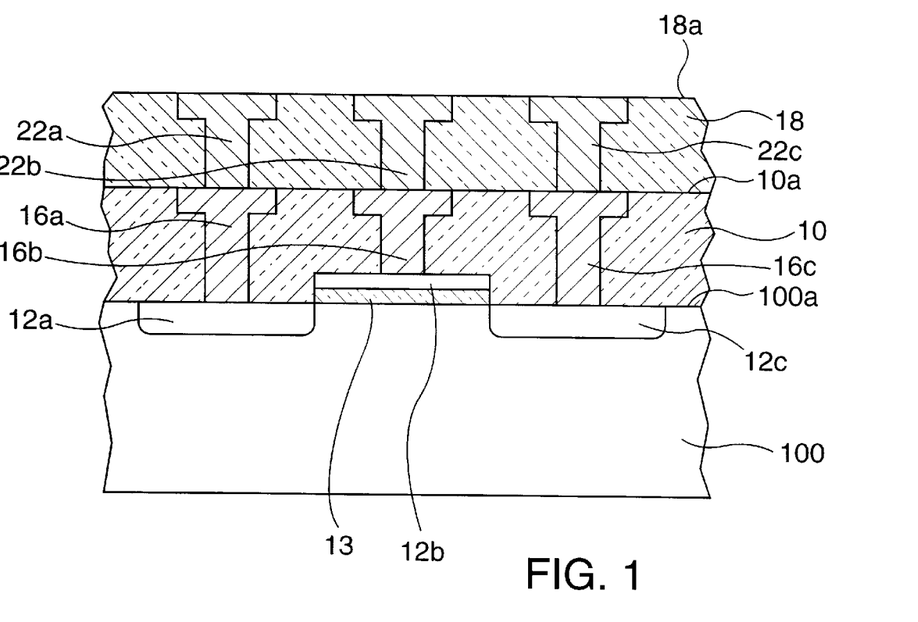

FIG. 1 shows a portion of a silicon wafer 100 over which there has been formed an insulating (dielectric) layer 10, typically of boron phospho silicate glass (BPSG). Wafer 100 is shown with an insulated gate field effect transistor formed in and over a top surface 100a thereof. The field effect transistor (device) comprises diffused regions 12a and 12c, the drain and source regions, respectively, and a gate region 12b which is over a dielectric gate layer 13 that lies on the top surface 100a of wafer 100 and is centered between the regions 12a and 12c. Typically the dielectric layer 13 and gate region 12b are first formed with the region 12b serving as a mask which allows for the regions 12a and 12c to be self aligned to the gate region 12b. Conventional photoprocessing is done to pattern layer 10 followed by etch processes to form vias (openings) through layer 10 to expose the diffusion regions 12a and 12c and the gate region 12b. Typically trenches are etched into a top surface 10a of layer 10. The vias and trenches in the layer 10 are then overfilled with metal 16a, 16b, and 16c, typically tungsten (W), and chem-mech polished to achieve a planar surface 10a. An insulating layer 18, typically of $SiO_2$, is deposited over the planarized surface 10a. Conventional photoresist and etching of the layer 18 provides vias and trenches which are overfilled with copper 22a, 22b, and 22c to provide metal to metal contact with the tungsten 16a, 16b, and 16c, respectively. The first Damascene process is completed with a top surface 18a of layer 18 being planarized with a chem-mech polish.

Figure 2:
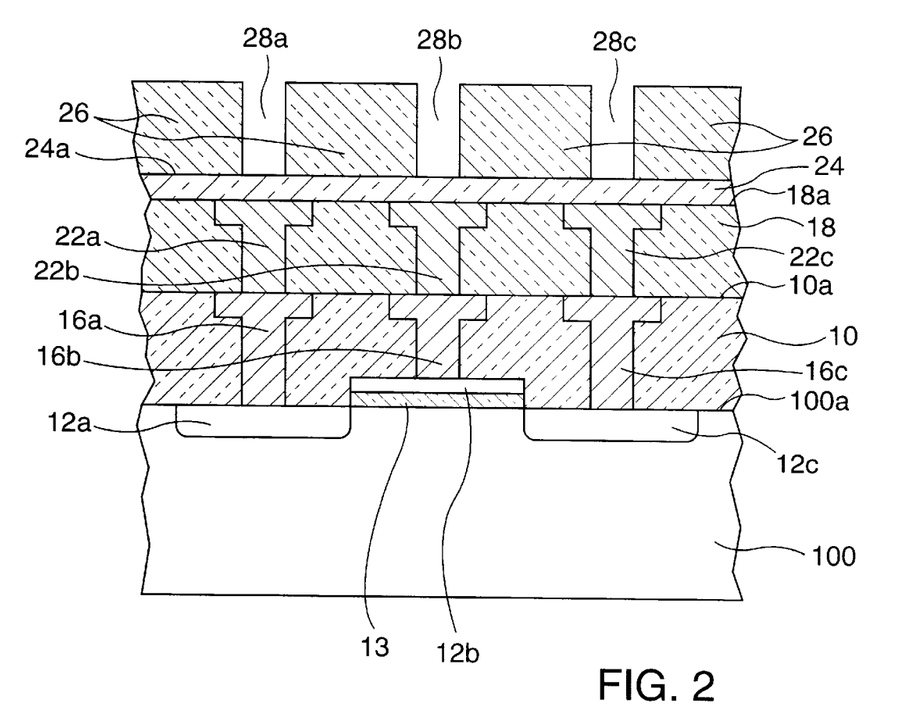

FIG. 2 shows the wafer 100 after an insulating layer 24, typically 50 nm PECVD of silicon nitride, has been deposited onto surface 18a to act as an etch barrier/cap layer, and an insulating layer 26, typically $SiO_2$, has been deposited over a top surface 24a of the silicon nitride layer 24. Photoresist (not shown) is then spun onto the layer 26. After the photoresist is patterned, the layer 26 is reactively ion etched to open vias 28a, 28b, and 28c. A post etch treatment, which is used to remove the photoresist and exposed portions of layer 26, stops on the silicon nitride barrier layer 24. This process provides a high degree of selectivity which gives a sharp end point with no reactive ion etch (RIE) lag and allows the vias 28a, 28b, and 28c to be fully opened.

Figure 3:
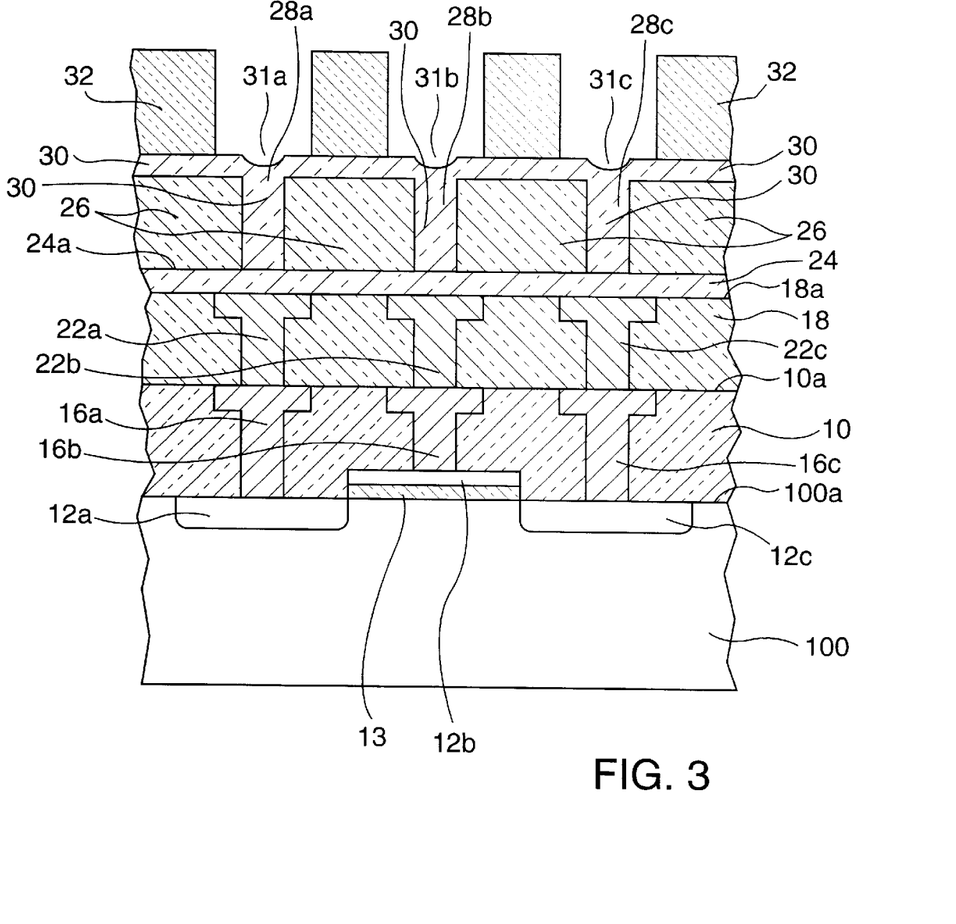

FIG. 3 shows the wafer 100 after a relatively thin antireflexive coating 30 has been spun onto the wafer 100 to cover the surfaces and to fill the vias 28a, 28b, and 28c in layer 26. It is important to insure that the vias 28a, 28b, and 28c are filled so that no voids are present. In practice, cross sections of a processed wafer show that the ARC material fills the trenches 28a, 28b, and 28c to about three fourths of its height.

For example, the ARC material, grade 1100A, is baked (first at 95° C. and then at 180° C.) and non-selectively RIE'd from the surface of the $SiO_2$ 26 with $C_4F_8+O_2$ for 40 seconds. A layer of photoresist 32, typically DUV30 MCSIII/JSR 130/6250, is then spun onto the wafer 100 and patterned to result in openings 31a, 31b, and 31c which expose portions of layer 30. Opening 31a, which is wider than via 28a, is located over and in communication with via 28a. Opening 31b, which is wider than via 28b, is located over and in communication with via 28b. Opening 31c, which is wider than via 28c, is located over and in communication with via 28c.

Figure 4:
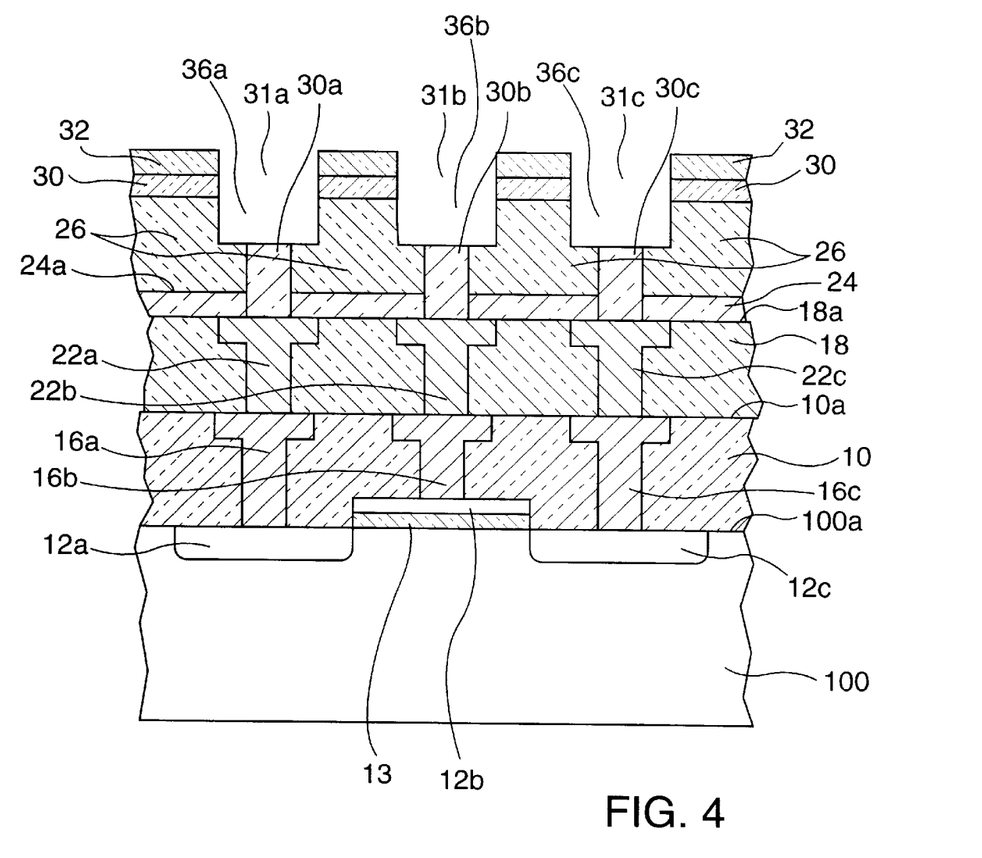

A low selective reactive ion etch, with a typical duration of 40 seconds, uses a combination of $C_4F_8$, Ar, and $O_2$, is used to etch the exposed portions of ARC layer 30 to expose portions of layer 26 which are then also etched. This results in the formation of trenches 36a, 36b, and 36c which are in communication with vias 28a, 28b, and 28c, respectively. FIG. 4 shows that ARC plugs 30a, 30b, and 30c remaining in the bottom of the vias 28a, 28b, and 28c, respectively, after this etch. This is because the ARC material is removed at a slower rate than the $SiO_2$ of layer 26. This prevents the $SiO_2$ etching ambient from touching the silicon nitride layer 24. FIG. 4 also shows that oxide layer 26 has been etched to integrate the trenches 36a, 36b, and 36c with the vias 28a, 28b, and 28c, respectively.

The etching of the oxide layer 26, when the ARC material 30 is in the vias, is achieved without the formation of 'fences' by tailoring the etch process to be compatible with the etching of both the $SiO_2$ and the ARC material instead of just the $SiO_2$. Fences are formed when the etchant removes material from the via at different rates depending on the material location. For example, it is possible to find a different etch rate for the ARC material in the center of the via when compared with the ARC material at the ARC/oxide interface.

A post etch treatment for 20–40 seconds removes the remaining ARC material 30a, 30b, and 30c from the vias 28a, 28b, and 28b, respectively, The silicon nitride layer 24 is then selectively etched away using $CHF_3+O_2$ for about 35 seconds. It is to be noted that all of the trenches, although wider than the vias in which they are in communication, do not have to extend over more than one side of a via.

After the normal cleaning steps have been completed the structure of FIG. 4 is ready for metal fill with copper.

Figure 5:
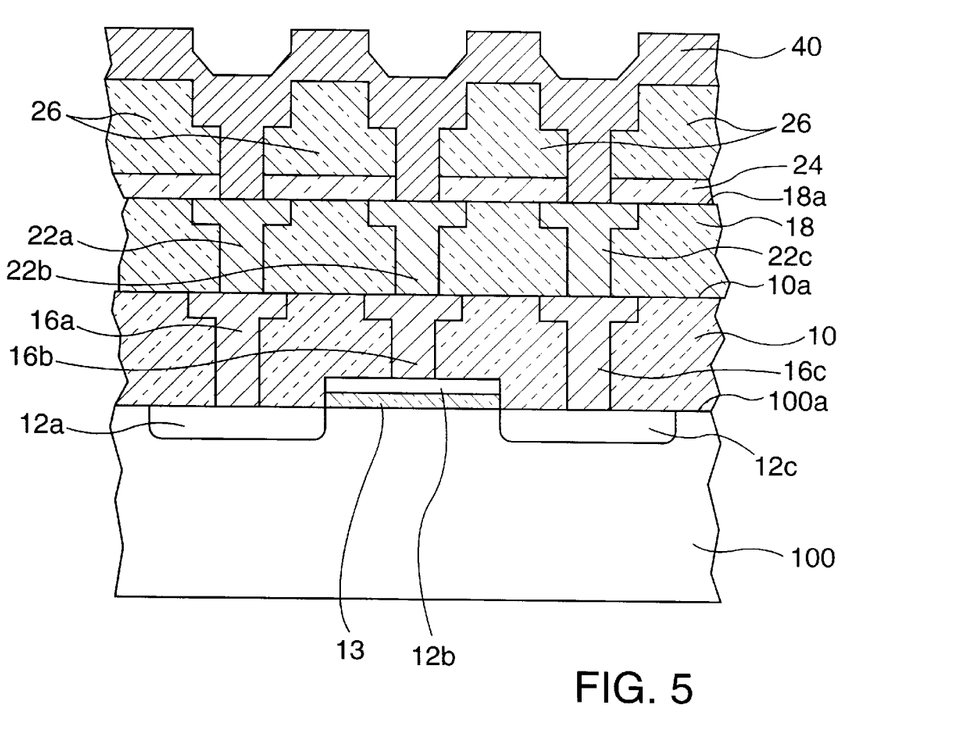

FIG. 5 shows the wafer 100 after the via/trench openings 28a/36a, 28b/36b have been overfilled with electroplated copper 40.

Figure 6:
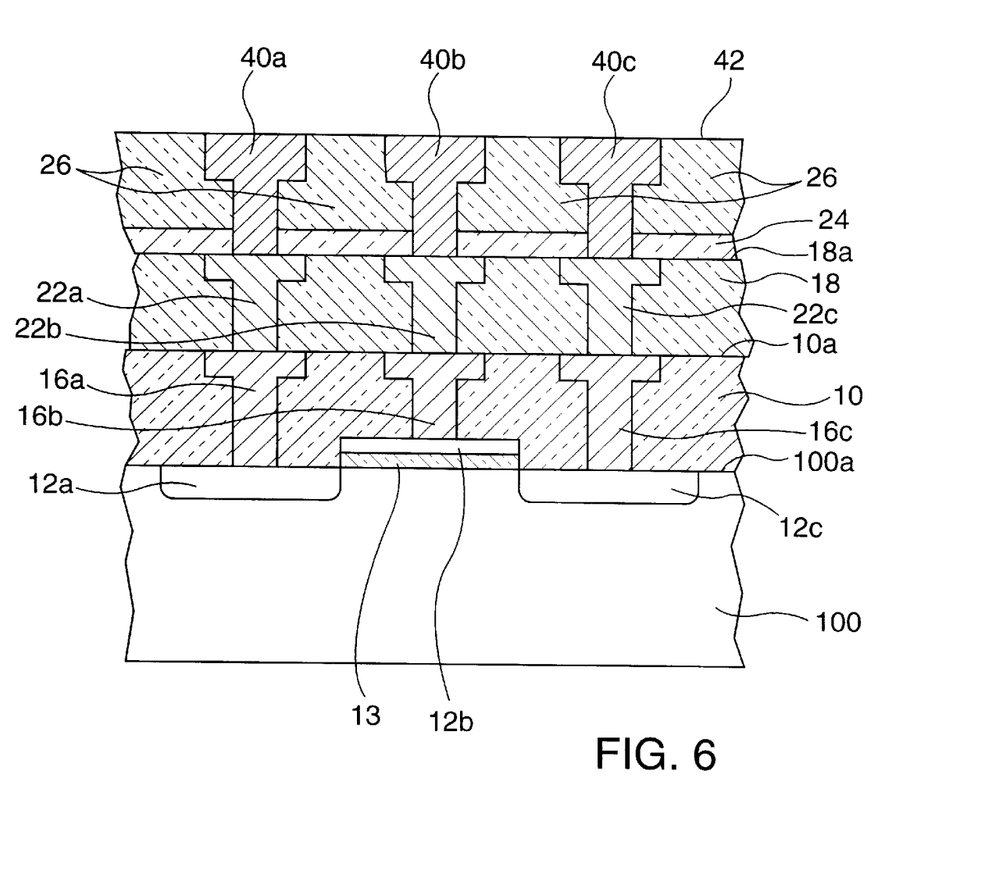

FIG. 6 shows the wafer 100 after a resulting top surface 42 has been planarized using a chem-mech polish to remove the excess copper leaving conductors 40a, 40b, and 40c. FIG. 6 also illustrates the result of the completed dual Damascene process for this level of metallization.

It is to be understood that the specific embodiment described is merely illustrative of the general principles of the invention and various other embodiments may be devised without departing from the basic teaching by a worker in the art. For example, the insulating layers can be other than silicon dioxide and the metal contacting the device of the semiconductive body could be aluminum. Further, in some applications some or all of the trenches need not be used with the vias extending completely through an insulating layer. Furthermore, the novel process of the present invention can be implemented starting at the trench portions of the first level of conductors with the metal 16a, 16b, and 16c being tungsten in the vias and being cooper in the trenches.

What is claimed is:

1. A method for forming over a semiconductive wafer, which contains therein and/or thereon devices having conductive contact regions, an interconnection pattern that uses copper in at least some vias and some trenches through insulating layers overlying a top surface of the semiconductor wafer, the method comprising the steps of:

forming a first insulating layer over the device;

forming vias from a top surface of the first insulating layer therethrough with the vias being in communication with the contact regions of the device;

filling the vias with a conductor;

forming a second insulating layer over the first insulating layer;

forming vias through the second insulating layer which are in communication with the conductor filled vias in the first insulating layer;

filling the vias through the second insulating layer with copper;

forming a third insulating layer over a top surface of the second insulating layer;

forming a fourth insulating layer over a top surface of the third insulating layer, the fourth insulating layer having a different etch characteristic than the third insulating layer;

patterning and etching the fourth insulating layer to form vias therethrough which are separated from the copper-filled vias through the second insulating layer by the third insulating layer but are aligned with the vias through the second insulating layer;

forming an anti-reflective layer over a top surface of the fourth insulating layer and filling the vias therethrough with anti-reflective material;

patterning the anti-relective layer and material to define trenches in the fourth insulating layer;

removing the layer of anti-reflective layer and a portion of the fourth insulating layer to form trenches in the fourth insulating layer which are in communication with top portions of the vias through the fourth insulating layer, and removing the anti-reflective material in the vias through the fourth insulating layer and a portion of the third insulating layer between the vias of the second and fourth insulating layers;

filling the trenches and vias in the fourth insulating layer and portions of the third insulating layer which were removed with copper.

2. The process of claim 1 in which the vias and trenches of the fourth insulating layer are overfilled with copper and chemical mechanical polishing is used to planarize the resulting structure.

3. The method of claim 1 wherein the first insulating layer is BPSG, the second and fourth insulating layers are silicon oxide, and the third insulating layer is silicon nitride.

4. The method of claim 1 wherein the conductor is tungsten.

5. The method of claim 1 wherein the conductor is aluminum.

6. The method of claim 1 further comprising the steps of:

forming trenches a top surfaces of the first insulating layer which are each in communication with a separate via through the first insulating layer and which are each filled with the conductor;

over filling the vias and trenches of the first insulating layer with the conductor and planarizing same using chemical mechanical polishing;

forming trenches in a top surface of the second insulating layer which are each in communication with a separate via of the second insulating layer and which are each filled with copper; and over filling the vias and trenches of the second insulating layer with copper and planarizing same using chemical mechanical polishing.

7. The method of claim 1 wherein the anti-reflective layer and the anti-reflective material have a different etch rate than the third insulating layer.

8. The method of claim 7 wherein the anti-reflective layer and the anti-reflective material are both DUV30.

9. The method of claim 7 in which the silicon nitride layer is deposited by PECVD.

10. A method for forming over a semiconductive wafer an interconnection pattern that is in insulating layers overlying the semiconductive wafer and that includes copper lines in trenches extending parallel to a top surface of the wafer and copper fill in vias that extend vertically through insulating layers, said method comprising the steps of:

forming over a top surface of the semiconductive wafer a first insulating layer;

forming trenches in a top surface of the first insulating layer and forming vias, which are in communication with the trenches, from bottoms of the trenches through the first insulating layer such that same are in communication with the contact regions of the device;

overfilling the vias and trenches of the first insulating layer with contact metal and planarizing to leave a first planar surface over the semiconductive wafer;

forming over the metal-filled first insulating layer a second insulating layer;

forming vias and trenches in the second insulating layer and overfilling the vias and trenches with copper;

forming a second planar surface on the copper-filled second insulating layer;

forming a silicon nitride layer over the planarized surface;

depositing a third insulating layer over the silicon nitride layer, said third insulating layer having a different etch rate than the silicon nitride layer;

patterning the third insulating layer to form vias therethrough which are aligned with the underlying copper, the silicon nitride film acting as an etch stop;

forming an anti-reflecting material layer over a top surface of the third insulating layer which also fills the vias therethrough;

depositing a layer of photoresist over the anti-reflective layer and the vias filled with the anti-reflective material;

patterning the photoresist and etching exposed portions of the anti-reflective layer and anti-reflective material in the vias and portions of the third insulating layer to form trenches in the third insulating layer;

removing the patterned photoresist, the anti-reflective material from the vias and a portion of the silicon nitride layer between the second and third insulating layers to result in each trench and the via there below in the third insulating layer being in communication with one of the vias in the second insulating layer; and overfilling the vias and trenches in the third insulating layer and the openings in the silicon nitride layer with copper and planarizing the surface to leave second copper-filled vias and trenches in the third insulating layer which extend through the openings in the silicon nitride layer and contact copper in the vias in the second insulating layer.

11. The process of claim 10 in which the first insulating layer is BPSG, and the second and third insulating layers are of silicon oxide.

12. The process of claim 10 in which chemical mechanical polishing is used to planarize surfaces of the insulating layers after same are overfilled with metal.

13. The method of claim 10 wherein the contact metal is tungsten.

14. The method of claim 10 wherein the contact metal is aluminum.

15. The method of claim 10 wherein the anti-reflective layer and the anti-reflective material have a different etch rate than the third insulating layer.

16. The method of claim 15 wherein the anti-reflective layer and the anti-reflective material are both DUV30.

17. The method of claim 10 in which the silicon nitride layer is deposited by PECVD.

* * * * *

UNITED STATES PATENT AND TRADEMARK OFFICE
CERTIFICATE OF CORRECTION

PATENT NO. : 6,576,550 B1 Page 1 of 1
DATED : June 10, 2003
INVENTOR(S) : Brase et al.

It is certified that error appears in the above-identified patent and that said Letters Patent is hereby corrected as shown below:

<u>Title page,</u>
Item [73], Assignee: add -- International Business Machines Corporation, Armonk, NY --

Signed and Sealed this

Twentieth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,576,550 B1  Page 1 of 1
APPLICATION NO. : 09/608541
DATED : June 10, 2003
INVENTOR(S) : Brase et al.

It is certified that error appears in the above-identified patent and that said Letters Patent is hereby corrected as shown below:

Item [73], Assignee: Delete "Infineon, AG" and replace with --Infineon Technologies AG--

Signed and Sealed this

Twelfth Day of September, 2006

JON W. DUDAS
*Director of the United States Patent and Trademark Office*